United States Patent
Saito et al.

(10) Patent No.: US 9,602,753 B2
(45) Date of Patent: Mar. 21, 2017

(54) SOLID-STATE IMAGING APPARATUS AND IMAGING SYSTEM

(71) Applicant: CANON KABUSHIKI KAISHA, Tokyo (JP)

(72) Inventors: Kazuhiro Saito, Tokyo (JP); Hiroaki Kameyama, Kawasaki (JP); Kohichi Nakamura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 214 days.

(21) Appl. No.: 14/618,143

(22) Filed: Feb. 10, 2015

(65) Prior Publication Data
US 2015/0237286 A1     Aug. 20, 2015

(30) Foreign Application Priority Data
Feb. 17, 2014   (JP) .................. 2014-027665

(51) Int. Cl.
| | |
|---|---|
| *H03M 1/34* | (2006.01) |
| *H04N 5/378* | (2011.01) |
| *H04N 5/335* | (2011.01) |
| *H04N 5/341* | (2011.01) |

(52) U.S. Cl.
CPC ............. *H04N 5/378* (2013.01); *H03M 1/34* (2013.01); *H04N 5/335* (2013.01); *H04N 5/3355* (2013.01); *H04N 5/341* (2013.01)

(58) Field of Classification Search
CPC ........ H04N 5/378; H04N 5/335; H04N 5/341; H04N 5/3355; H03M 1/34
USPC ................................................. 341/164, 155
See application file for complete search history.

(56) References Cited

U.S. PATENT DOCUMENTS

| | | | |
|---|---|---|---|
| 7,528,878 B2 | 5/2009 | Sato et al. | |
| 8,355,068 B2 * | 1/2013 | Kondo | ................... H04N 5/378 348/308 |
| 8,451,360 B2 | 5/2013 | Nakamura et al. | |
| 8,553,118 B2 | 10/2013 | Saito et al. | |
| 8,598,901 B2 | 12/2013 | Hiyama et al. | |
| 8,711,259 B2 | 4/2014 | Maehashi et al. | |

(Continued)

FOREIGN PATENT DOCUMENTS

JP     2013-93837     5/2013

OTHER PUBLICATIONS

U.S. Appl. No. 14/663,592, filed Mar. 20, 2015.

(Continued)

*Primary Examiner* — Brian Young
(74) *Attorney, Agent, or Firm* — Fitzpatrick, Cella, Harper & Scinto

(57) ABSTRACT

A solid-state imaging apparatus includes: a comparator comparing a signal output from pixels with a reference signal of which level changes dependent on time; a plurality of first bit storage units and a plurality of second bit storage units holding, bit by bit, a count signal of the plurality of bits from a counter, according to a write control signal based on a result of the comparing by the comparator; and a control unit arranged between the comparator and the first and second bit storage units, and adjusting a delay time of the write control signal. An order of lengths of the delay time of the count signal held by the first and second bit storage units is the same as an order of lengths of the delay time of the write control signal of the first and second bit storage units.

20 Claims, 7 Drawing Sheets

(56) References Cited

U.S. PATENT DOCUMENTS

| | | |
|---|---|---|
| 8,836,838 B2 | 9/2014 | Nakamura et al. |
| 8,848,079 B2 | 9/2014 | Itano et al. |
| 8,928,786 B2 | 1/2015 | Iwata et al. |
| 9,029,752 B2 | 5/2015 | Saito et al. |
| 9,124,834 B2 * | 9/2015 | Okura .................. H04N 5/3742 |
| 9,179,073 B2 * | 11/2015 | Mabuchi ............... H04N 5/2351 |
| 9,313,436 B2 * | 4/2016 | Ookuma ................ H04N 5/378 |
| 2013/0062503 A1 | 3/2013 | Saito et al. |
| 2013/0068930 A1 | 3/2013 | Nakamura et al. |
| 2014/0043511 A1 | 2/2014 | Iwata et al. |

OTHER PUBLICATIONS

U.S. Appl. No. 14/614,980, filed Feb. 5, 2015.
U.S. Appl. No. 14/591,168, filed Jan. 7, 2015.
U.S. Appl. No. 14/591,180, filed Jan. 7, 2015.

* cited by examiner

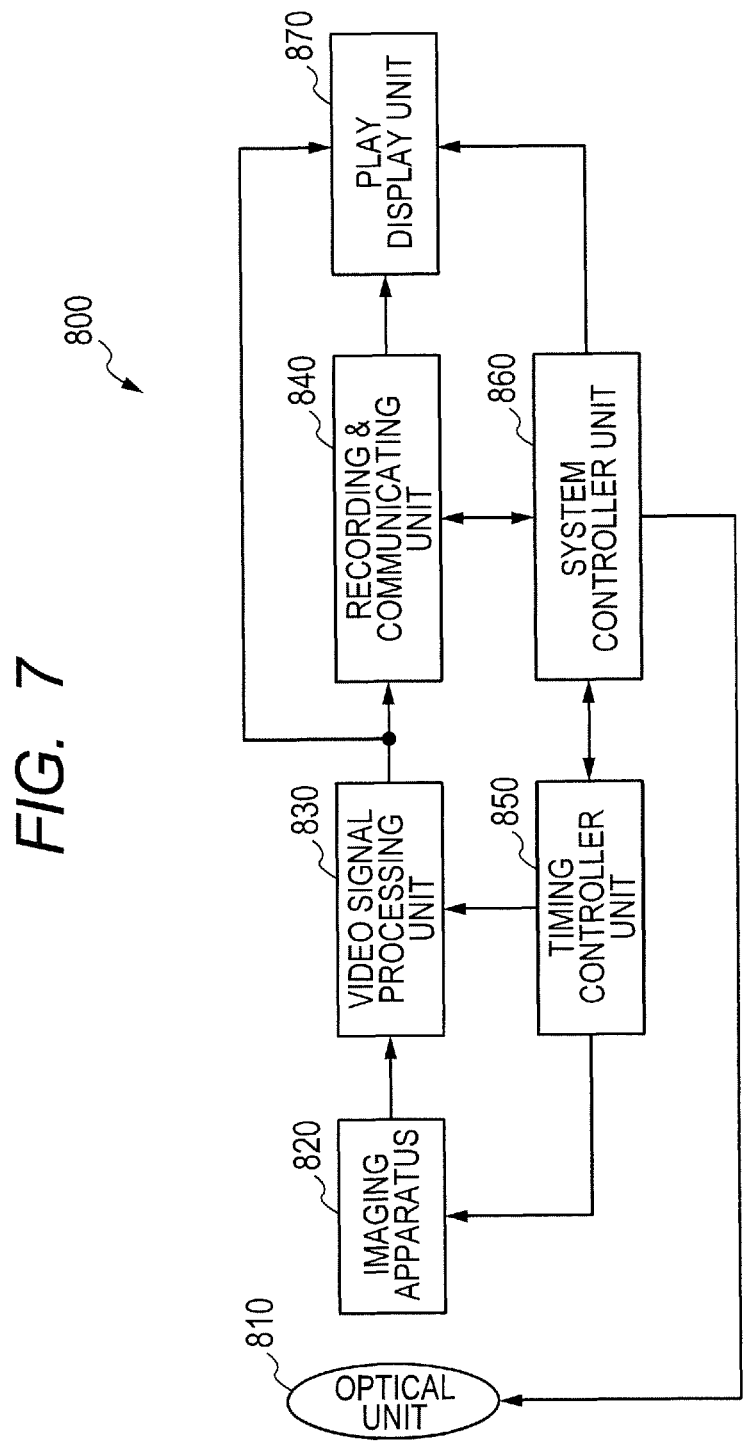

SOLID-STATE IMAGING APPARATUS AND IMAGING SYSTEM

BACKGROUND OF THE INVENTION

Field of the Invention

The present invention relates to a solid-state imaging apparatus and an imaging system.

Description of the Related Art

A CMOS image sensor internally including an AD (analog-to-digital) conversion circuit is used for an image input apparatus, such as a digital camera. Japanese Patent Application Laid-Open No. 2013-93837 discloses a configuration that includes AD conversion circuits on respective columns of a pixel array. The configuration is thus disclosed where each AD conversion circuit causes a comparator to compare a pixel signal with a reference signal and hold count values supplied from a counter in first and second column memories, based on the result of the comparing. The counter is provided for the plurality of AD conversion circuits in a shared manner.

SUMMARY OF THE INVENTION

According to an aspect of the present invention, a solid-state imaging apparatus comprising: a plurality of pixels arranged in a matrix, and outputting a signal based on photoelectric conversion and a signal based on a reset-state; a comparator configured to compare the signal outputted from the pixel with a reference signal of which level changes dependent on time; a counter configured to output a count signal of a plurality of bits; a plurality of first bit storage units configured to hold, bit by bit, the count signal, according to a write control signal based on a result of the comparing by the comparator; a plurality of second bit storage units configured to hold, bit by bit, the count signal, according to a write control signal based on a result of the comparing by the comparator; and a control unit configured to output the write control signal, wherein the plurality of first bit storage units hold the count signal at a time of comparing the signal based on the reset-state of the pixel, the plurality of second bit storage units hold the count signal at a time of comparing the signal based on the photoelectric conversion of the pixel, and an order of lengths of a delay time of the count signal held by the plurality of first bit storage units is same as an order of lengths of the delay time of the write control signal of the plurality of first bit storage units, an order of lengths of a delay time of the count signal held by the plurality of second bit storage units is same as an order of lengths of the delay time of the write control signal of the plurality of second bit storage units.

Further features of the present invention will become apparent from the following description of exemplary embodiments with reference to the attached drawings.

BRIEF DESCRIPTION OF THE DRAWINGS

FIG. 7 is a diagram illustrating a configuration example of an imaging system according to a fourth embodiment.

DESCRIPTION OF THE EMBODIMENTS

Preferred embodiments of the present invention will now be described in detail in accordance with the accompanying drawings.

During writing of a count signal into a column memory, a difference occurs between an amount of delay of a count signal and an amount of delay of a control signal from a comparator that controls writing of a count value into the column memory. There is a problem in that a large difference between the amount of delay for a first column memory and the amount of delay for a second column memory degrades linearity of AD conversion.

The following technique relates to a solid-state imaging apparatus and an imaging system that can improve the linearity of AD conversion.

First Embodiment

Figure 1:
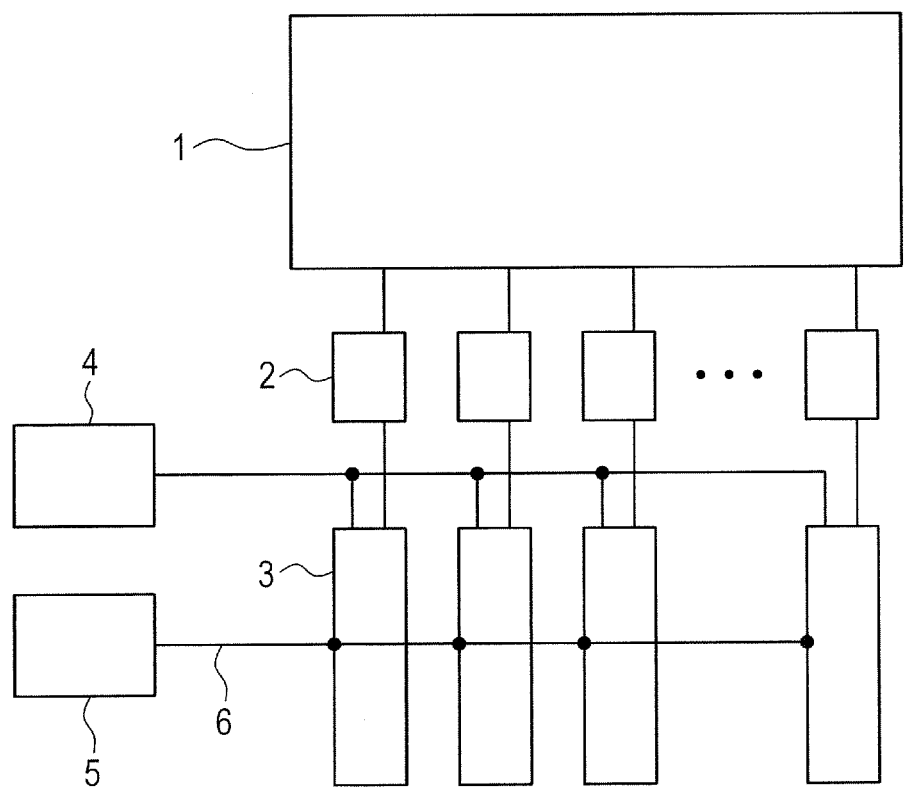
FIG. 1 is a diagram illustrating a configuration example of a solid-state imaging apparatus.

FIG. 1 is a diagram illustrating a configuration example of a solid-state imaging apparatus according to a first embodiment of the present invention. The solid-state imaging apparatus includes a pixel unit 1, read out circuits 2, column AD converters 3, a reference signal generator 4 and a common counter 5. The pixel unit 1 includes pixels that are two-dimensionally arranged and output signals based on photoelectric conversion. In the pixel unit 1, the pixels on rows are sequentially selected, and pixel signals on the selected row are output to the read out circuits 2. The read out circuits 2 are provided on respective columns of the pixel unit 1. The read out circuit 2 on the columns read and hold the pixel signals on the respective columns. The column AD converters 3 are arranged on the respective columns of the pixel unit 1. The reference signal generator 4 generates a reference signal (ramp signal) of which level changes dependent on time, and outputs the reference signal to the column AD converters 3 on the respective columns. The common counter 5 counts multiple-bit count values, and outputs the count signals to the column AD converters 3 on the respective columns via the bus line 6. The column AD converters 3 on the respective columns compare the signals output from the read out circuits 2 on the respective columns with the reference signal generated by the reference signal generator 4, and convert the pixel signals output from the read out circuits 2 on the respective columns into digital signals. The bus line 6 may be provided with a buffer for each column or the column AD converters 3 on multiple columns.

Figure 2:
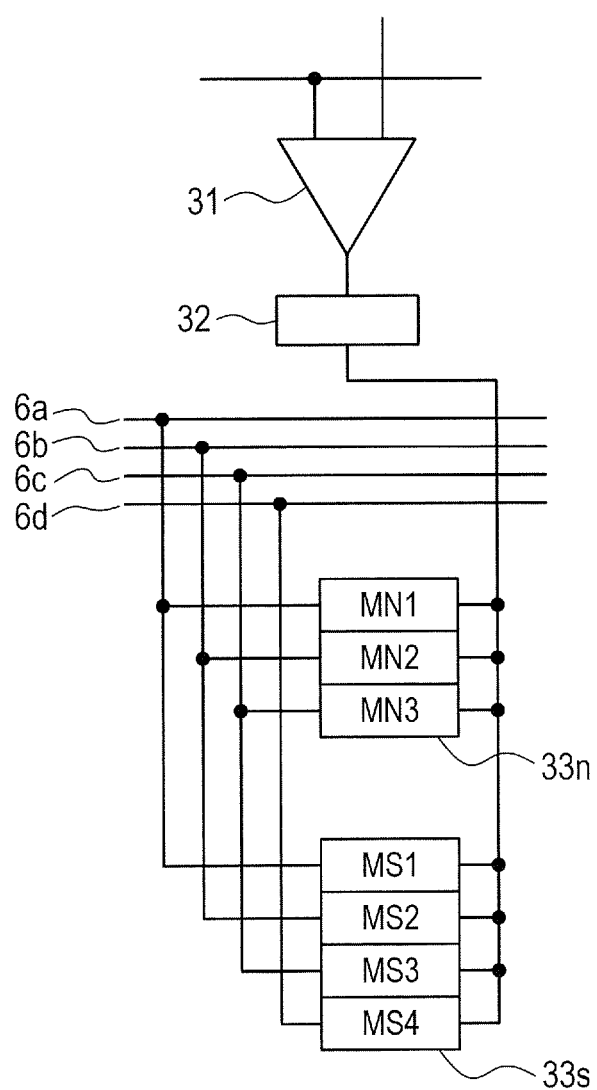
FIG. 2 is a diagram illustrating a layout of a configuration example of a column AD converter according to a first embodiment.

FIG. 2 is a diagram illustrating a layout of a configuration example of the column AD converter 3. The column AD converter 3 includes a comparator 31, a latch control circuit 32, storage units 33n and 33s. Bit bus lines 6a to 6d correspond to the bus line 6 in FIG. 1. The common counter 5 supplies the storage units 33n and 33s with the count signal representing the count value via the bus lines 6a to 6d. The comparator 31 compares the signal output from the read out circuit 2 with the reference signal generated by the reference signal generator 4, and outputs a comparison result signal to the latch control circuit 32. The latch control circuit 32 outputs a latch signal according to the comparison result signal. The storage unit (N memory) 33n includes bit storage units (first bit storage units) MN1 to MN3. In a reset-state of the pixels of the pixel unit 1, the bit storage units MN1 to MN3 hold, bit by bit, lower 3-bit count values via the bit bus lines 6a to 6c according to the latch signal (write control signal) output from the latch control circuit 32. The storage unit 33n stores noise signals of the pixels of the pixel unit 1 in the reset-state of the pixels. The storage unit (S memory) 33s includes bit storage units (second bit storage units) MS1 to MS4. The bit storage units MS1 to MS4 hold, bit by bit, 4-bit count values in a non-reset-state of the pixels of the pixel unit 1 via the bit bus lines 6a to 6d according to the latch signal (write control signal) output from the latch control circuit 32. The storage unit 33s stores pixel signals based on photoelectric conversion of the pixels of the pixel unit 1 in the non-reset-state of the pixels. The storage units 33n and 33s are arranged in one column with respect to the latch control circuit 32. The arrangement order of the storage units 33n and 33s is according to an order of the bit storage units MN1, MN2, MN3, MS1, MS2, MS3 and MS4 from the side nearer to the latch control circuit 32. The first bit storage units MN1 to MN3 and the second bit storage units MS1 to MS4 are arranged adjacent to each other. The output bus lines (output lines) 6a to 6d of the common counter 5 and the latch control circuit 32 are arranged on one side of the first bit storage units MN1 to MN3 and second bit storage units MS1 to MS4 arranged adjacent to each other.

The latch control circuit 32 latches the output signal of the comparator 31 and outputs the signal to the storage units 33n and 33s. When the output signal of the comparator 31 is reversed, the storage units 33n and 33s hold the count values of the bus lines 6a to 6c and the count values of the bus lines 6a to 6d, respectively. The latch control circuit 32 is provided for malfunction prevention, overflow function, and displacement current elimination in the storage units 33n and 33s. The latch control circuit 32 is provided between the comparator 31 and the storage units 33n and 33s, and is a delay adjusting unit for adjusting the delay time of the latch signal, and may be a buffer circuit.

The output signal of the read out circuit 2 and the reference signal of the reference signal generator 4 are input into the differential input terminals of the comparator 31. The comparator 31 compares the magnitude of the output signal of the read out circuit 2 with the magnitude of the reference signal, and outputs a high level or low level signal according to the result of the comparing. When the magnitude relationship between the output signal of the read out circuit 2 and the reference signal is reversed, the output signal of the comparator 31 transitions from the high level to the low level or from the low level to the high level. At the timing when the output signal of the comparator 31 is reversed, the latch control circuit 32 outputs the latch signal (pulse signal). At the timing when the latch control circuit 32 outputs the latch signal, the storage units 33n and 33s hold the count values output from the common counter 5. Pieces of digital data stored in the storage units 33n and 33s are sequentially output to a video signal processing unit 830 (FIG. 7). The video signal processing unit 830 removes noise by taking a difference between the count value stored in the storage unit 33n and the count value stored in the storage unit 33s, extracts a signal component of the pixels, performs an operation process as necessary, and outputs the signal.

Figure 3:
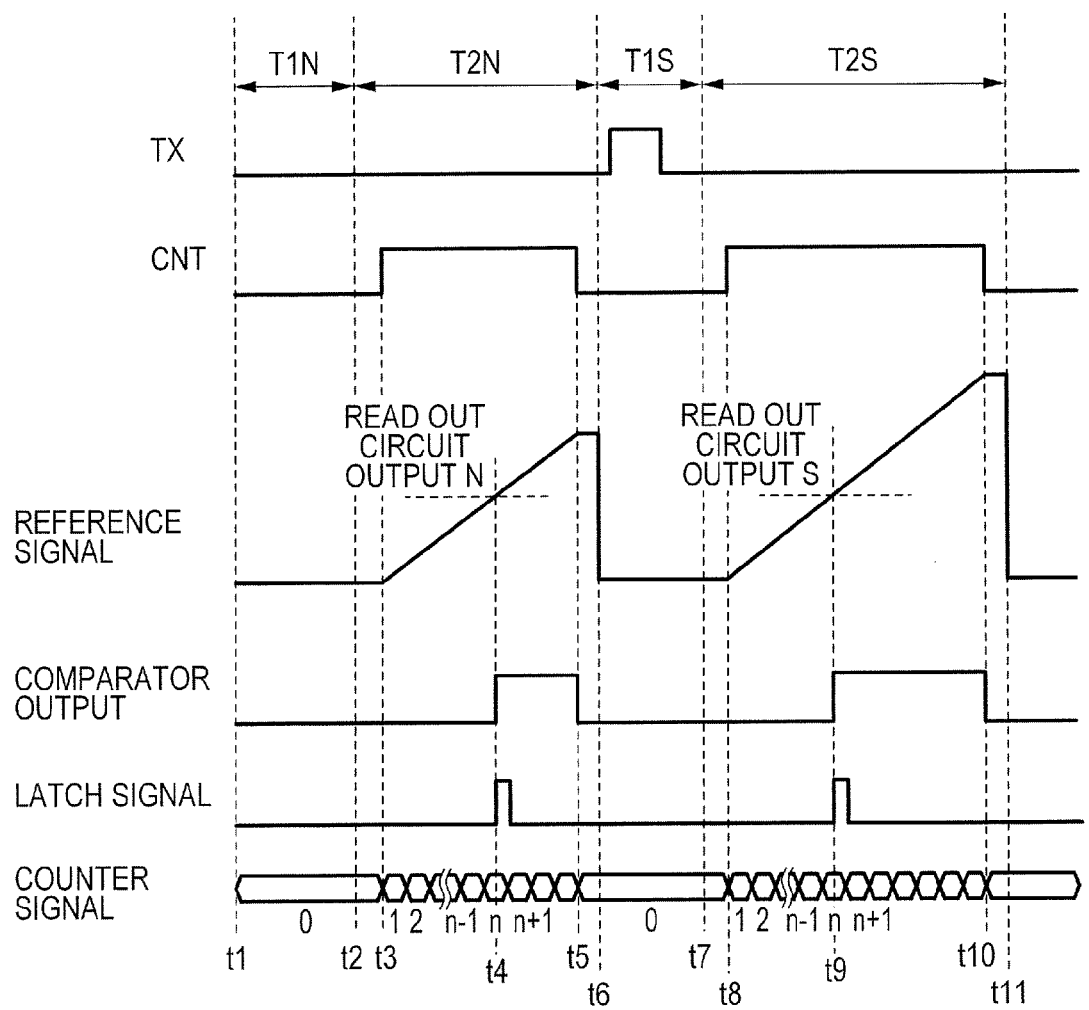
FIG. 3 is a timing chart of AD conversion.

FIG. 3 is a timing chart for illustrating a method of driving the solid-state imaging apparatus in FIG. 1. The timing chart illustrates the timing when the pixel signals on one row are AD-converted. A time period T1N from time t1 to t2 is a read out time period for the noise signal. From the time t1 to t2, the read out circuit 2 reads and holds the noise signal of the pixels of the pixel unit 1 in the reset-state of the pixels of the pixel unit 1. A time period T2N from time t2 to t6 is an AD conversion time period for the noise signal. At the time t3, the signal CNT becomes the high level, the common counter 5 starts counting up the count value, outputs the count signal, and the reference signal generator 4 starts generating the reference signal (ramp signal). At the time t4, the reference signal becomes higher than an output signal N of the read out circuit 2, and the output signal of the comparator 31 transitions from the low level to the high level. At the time t4, the count signal of the common counter 5 represents, for instance, a count value of "n". When the output signal of the comparator 31 transitions from the low level to the high level, the latch control circuit 32 outputs the latch signal (pulse signal). When the latch signal is input, the count signal (count value of "n") output from the common counter 5 is written into the storage unit 33n and this unit holds the signal. At the time T5, the signal CNT becomes the low level, the common counter 5 finishes counting up the count value, resets the count value to zero, and the reference signal generator 4 finishes generating the reference signal. At the time t6, the AD conversion time period for the noise signal is finished, and the reference signal is reset.

A time period T1S from time t6 to t7 is a read out time period for the pixel signal. From the time t6 to t7, the signal TS becomes a high-level pulse, the pixel on each column on the selected row in the pixel unit 1 outputs the pixel signal based on the photoelectric conversion to the read out circuit 2 on the corresponding column. The read out circuit 2 reads and holds the pixel signal based on photoelectric conversion for the pixels of the pixel unit 1 in the non-reset-state of the pixels of the pixel unit 1. A time period T2S from the time t7 to t11 is an AD conversion time period for the pixel signal. At the time t8, the signal CNT becomes the high level, the common counter 5 starts counting up the count value, outputs the count signal, and the reference signal generator 4 starts generating the reference signal. At the time t9, the reference signal becomes higher than the output signal S of the read out circuit 2, and the output signal of the comparator 31 transitions from the low level to the high level. At the time t9, the count signal of the common counter 5 represents, for instance, the count value of "n". When the output signal of the comparator 31 transitions from the low level to the high level, the latch control circuit 32 outputs the latch signal (pulse signal). When the latch signal is input, the count signal (count value of "n") output from the common counter 5 is written into the storage unit 33s and this unit holds the signal. Here, the example of imaging during dark time is described. The noise signal N at the time when the pixels are reset is equal to the pixel signal S at the time when the pixels are not reset. Both of the count value stored in the storage unit 33n and the count value stored in the storage unit 33s are n. At the time t10, the signal CNT becomes the low level, the common counter 5 finishes counting up the count value, the count value is reset to zero, and the reference signal generator 4 finishes generating the reference signal. At the time t11, the AD conversion time period for the pixel signal is finished, and the reference signal is reset. Subsequently, the count values in each column stored in the storage units 33n and 33s are sequentially output as digital data corresponding to the pixel signal and the noise signal to a video signal processing unit 830 (FIG. 7). The process is repeated while the row of the pixels to be read is changed, thereby allowing the pixels on all or a part of the rows to be read.

Figure 4:
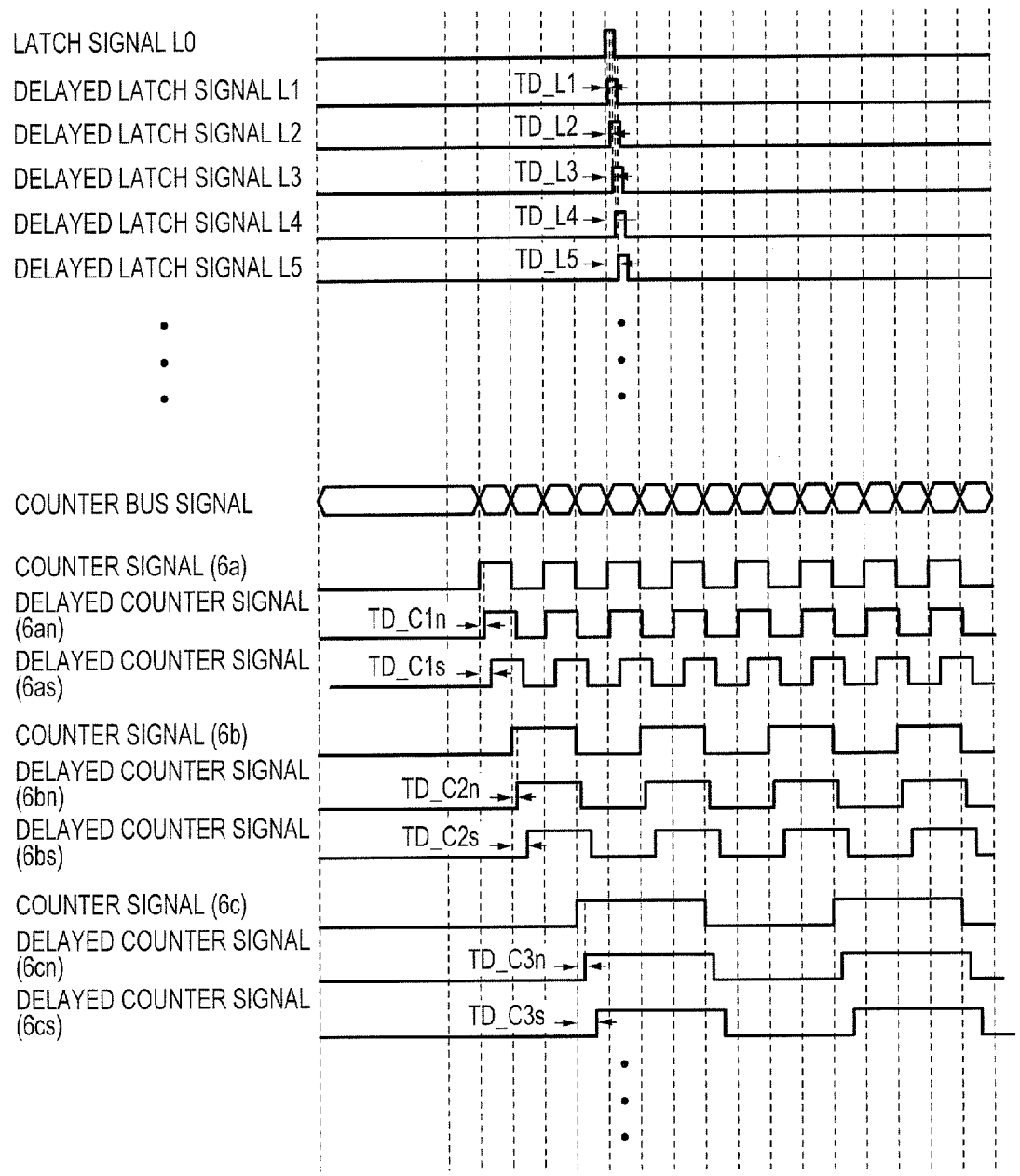
FIG. 4 is a timing chart illustrating the AD conversion in detail.

FIG. 4 is a timing chart illustrating the transmission delay of signals from the latch control circuit 32 and the common counter 5 to the storage units 33n and 33s. First, the transmission delay of the latch signal from the latch control circuit 32 to the storage units 33n and 33s is described. In FIG. 2, the output line of the latch control circuit 32 is connected to each of the bit storage units MN1, MN2 and MN3 of the storage unit 33n, and each of the bit storage units MS1, MS2, MS3 and MS4 of the storage unit 33s. In FIG. 4, a latch signal L0 is a signal immediately after output from the latch control circuit 32. A delayed latch signal L1 is a latch signal input into the bit storage unit MN1, and is a signal delayed from the latch signal L0 by a delay time TD_L1. A delayed latch signal L2 is a latch signal input into the bit storage unit MN2, and is a signal delayed from the latch signal L0 by a delay time TD_L2. A delayed latch signal L3 is a latch signal input into the bit storage unit MN3, and is a signal delayed from the latch signal L0 by a delay time TD_L3. A delayed latch signal L4 is a latch signal input into the bit storage unit MS1, and is a signal delayed from the latch signal L0 by a delay time TD_L4. A delayed latch signal L5 is a latch signal input into the bit storage unit MS2, and is a signal delayed from the latch signal L0 by a delay time TD_L5. A delayed latch signal L6 is a latch signal input into the bit storage unit MS3, and is a signal delayed from the latch signal L0 by a delay time TD_L6. A delayed latch signal L7 is a latch signal input into the bit storage unit MS4, and is a signal delayed from the latch signal L0 by a delay time TD_L7. The delay times TD_L1 to TD_L7 increase with the distance from the latch control circuit 32 to the bit storage units MN1 to MN3, MS1 to MS4.

Next, the transmission delay of the count signal from the common counter 5 to the storage units 33n and 33s is described. The output bus line 6 of the common counter 5 includes the 4-bit bus lines 6a to 6d. The bit bus line 6a is connected to the bit storage units MN1 and MS1. The bit bus line 6b is connected to the bit storage units MN2 and MS2. The bit bus line 6c is connected to the bit storage units MN3 and MS3. The bit bus line 6d is connected to the bit storage unit MN4. The counter bus signal represents the count signal of the bus line 6. The count signal on the bit bus line 6a is a first bit (least significant bit) of the count signal. The count signal on the bit bus line 6b is a second bit of the count signal. The count signal on the bit bus line 6c is a third bit count signal. The count signal on the bit bus line 6d is a fourth bit (most significant bit) of the count signal.

A delayed count signal 6an is a count signal input from the bit line 6a into the bit storage unit MN1, and a signal delayed from the count signal on the bit line 6a by a delay time TD_C1n. A delayed count signal 6as is a count signal input from the bit line 6a into the bit storage unit MS1, and a signal delayed from the count signal on the bit line 6a by a delay time TD_C1s. The bit storage unit MS1 is farther to the common counter 5 than the bit storage unit MN1. Accordingly, the delay time TD_C1s is longer than the delay time TD_C1n.

A delayed count signal 6bn is a count signal input from the bit line 6b into the bit storage unit MN2, and is a signal delayed from the count signal on the bit line 6b by a delay time TD_C2n. A delayed count signal 6bs is a count signal input from the bit line 6b into the bit storage unit MS2, and is a signal delayed from the count signal on the bit line 6b by a delay time TD_C2s. The bit storage unit MS2 is farther to the common counter 5 than the bit storage unit MN2. Accordingly, the delay time TD_C2s is longer than the delay time TD_C2n. The bit storage units MN2 and MS2 are farther to the common counter than the bit storage units MN1 and MS1, respectively. Accordingly, the delay times TD_C2n and TD_C2s are longer than the delay times TD_C1n and TD_C1s, respectively.

A delayed count signal 6cn is a count signal input from the bit line 6c into the bit storage unit MN3, and is a signal delayed from the count signal on the bit line 6c by a delay time TD_C3n. A delayed count signal 6cs is a count signal input from the bit line 6c into the bit storage unit MS3, and is a signal delayed from the count signal on the bit line 6c by a delay time TD_C3s. The bit storage unit MS3 is farther to the common counter 5 than the bit storage unit MN3. Accordingly, the delay time TD_C3s is longer than the delay time TD_C3n. The bit storage units MN3 and MS3 are farther to the common counter than the bit storage units MN2 and MS2, respectively. Accordingly, the delay times TD_C3n and TD_C3s are longer than the delay times TD_C2n and TD_C2s, respectively.

A delayed count signal 6ds is a count signal input from the bit line 6d into the bit storage unit MS4, and is a signal delayed from the count signal on the bit line 6d by a delay time TD_C4s. The bit storage unit MS4 is farther to the common counter 5 than the bit storage unit MS3. Accordingly, the delay time TD_C4s is longer than the delay time TD_C3s.

An important point of this embodiment is that the order of increase in delay times of the delayed latch signals L1 to L7 with respect to the bit storage units MN1 to MN3 and MS1 to MS4 is the same as the order of increase in delay time of the delayed count signal.

Japanese Patent Application Laid-Open No. 2013-93837 discloses an arrangement concept of the storage unit (N memory) 33n and the storage unit (S memory) 33s with respect to the count signal. However, Japanese Patent Application Laid-Open No. 2013-93837 does not disclose the arrangement of the bit storage units MN1 to MN3 and MS1 to MS4, and does not disclose the arrangement of the bit storage units MN1 to MN3 and MS1 to MS4 with respect to the latch control circuit 32. It is a manner of course that Japanese Patent Application Laid-Open No. 2013-93837 does not disclose the problem of degrading the linearity of AD conversion caused by the circuit arrangement. For instance, as illustrated in FIG. 4 in Japanese Patent Application Laid-Open No. 2013-93837, the count signal bus 6 is arranged at the middle between the N memory and the S memory. Furthermore, the N memory and the S memory are arranged from the lower bit to the higher bit, according to an order from the position nearer to farther to count signal lines 83n and 83s. The latch control circuit is arranged between the comparator and the column memory. In this case, on the higher-bit side of the N memory, the delay of the latch signal is short but the delay of the count signal is long. For instance, the delay time of the latch signal is TD_L1, and the delay time of the count signal is TD_C3n. Meanwhile, on the higher-bit side of the S memory, both of the delay of the latch signal and the delay of the count signal are long. For instance, the delay time of the latch signal is TD_L7, and the delay time of the count signal is TD_C4s. The difference between the N signal (noise signal) and the S signal (pixel signal) that have different orders of increase in delay time indicates a large delay deviation. As a result, the linearity of AD conversion is degraded. In particular, a binary-coded count signal has a large adverse effect on an image caused by the degradation. Note that this point is not limited to the binary-coded signal.

In view of this problem, this embodiment has the following three characteristics.

(1) As to the bit storage units MN1 to MN3 and MS1 to MS4 of the storage units 33n and 33s, the order of increase in delay time of the latch signal is the same as the order of increase in delay time of the count signal.

(2) To adjust the delay time between the comparator 31 and the storage units 33n and 33s, the latch control circuit 32 (or a buffer circuit) is arranged after the comparator 31. This arrangement can make the delay time of the latch signal be close to the delay time of the count signal.

(3) The count signal bus line 6 and the latch control circuit 32 (or buffer circuit) are arranged at substantially identical positions with respect to the storage units 33n and 33s.

As described above, the order of lengths of the delay times of the count signals in the bit storage units MN1 to MN3 and the bit storage units MS1 to MS4 is the same of the order of lengths of the delay times of the latch signals in the bit storage units MN1 to MN3 and the bit storage units MS1 to MS4. That is, the order of the lengths of lines of the count signals in the bit storage units MN1 to MN3 and the bit storage units MS1 to MS4 is the same as the order of the lengths of lines of the latch signals at the bit storage units MN1 to MN3 and the bit storage units MS1 to MS4.

In FIG. 2, the delay times of the count signals and the delay times in the bit storage units MS1 to MS4 are longer than the delay times of the count signal and the delay times of the latch signals in the bit storage units MN1 to MN3. The storage units 33n and 33s may be replaced with each other. The delay times of the count signals and the delay times of the latch signals in the bit storage units MN1 to MN3 may be configured longer than the delay times of the count signals and the delay times of the latch signals in the bit storage units MS1 to MS4.

According to this embodiment, at the bit storage units MN1 to MN3 and MS1 to MS4, the relative delay time difference between the latch signal and the count signal can be reduced, thereby allowing the linearity of AD conversion to be improved.

Second Embodiment

Figure 5:
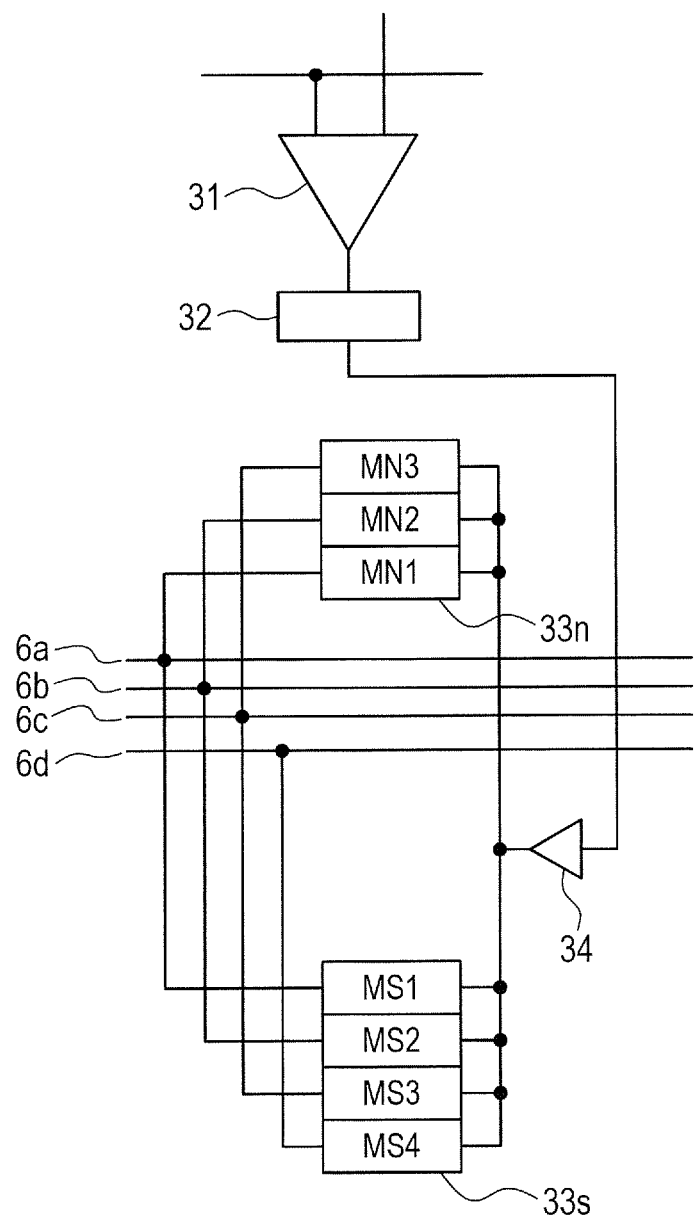
FIG. 5 is a diagram illustrating a layout of a configuration example of a column AD converter according to a second embodiment.

FIG. 5 is a diagram illustrating a layout of a configuration example of a column AD converter 3 according to a second embodiment of the present invention. The difference between this embodiment (FIG. 5) and the first embodiment (FIG. 2) is hereinafter described. A buffer circuit 34 is connected between an output terminal of the latch control circuit 32 and the storage units 33n and 33s. The buffer circuit 34 is a delay adjusting unit that can adjust the delay time from the latch control circuit 32 to the branching point of the storage units 33n and 33s. Furthermore, a buffer circuit corresponding to the buffer circuit 34 may be provided at a point from the count signal bus lines 6a to 6d to the branching point of the storage units 33n and 33s. A configuration without the buffer circuit 34 may be adopted.

In this embodiment, to make the delay time of the latch signal be close to the delay times of the count signals in the storage units 33n and 33s, the branching point of the latch signal from the latch control circuit 32 may be arranged between the storage units 33n and 33s, in a manner analogous to that of the count signal. That is, the count signal and the latch signal branch between the bit storage units MN1 to MN3 and the bit storage units MS1 to MS4. The bit storage units MN1 to MN3 and MS1 to MS4 are arranged in the same order with reference to the distances to both of the branching point of the latch signal and the branching point of the count signal. The output bus lines (output lines) 6a to 6d of the common counter 5 and the buffer 34 are arranged between the first bit storage units MN1 to MN3 and the second bit storage units MS1 to MS4. This arrangement can align the orders of the delay times of the count signals and the latch signals in the bit storage units MN1 to MN3 and MS1 to MS4, thereby allowing the delay time difference between the count signal and the latch signal to be reduced.

In this embodiment, the arrangement of the bit storage units MN1 to MN3 and the bit storage units MS1 to MS4 are configured vertically symmetrical with respect to the branching point of the latch signal and the branching point of the count signal. This arrangement can relatively match the transmission delay times of the latch signals and the count signals at the bit storage units MN1 to MN3 and MS1 to MS4 with each other, thereby allowing the delay time difference to be reduced.

In this embodiment, only the buffer circuit 34 is arranged between the storage units 33n and 33s. Likewise, the latch control circuit 32 may also be arranged between the storage units 33n and 33s.

For convenience, the bit storage units MN1 to MN3 and MS1 to MS4 are arranged in an order corresponding to the order from the least significant bit to the most significant bit. Alternatively, another configuration may be adopted only if the order of the bits of the bit storage units MN1 to MN3 and MS1 to MS4 is aligned. That is, any of the ascending and descending orders may be adopted.

In other words, the order of lengths of the delay times of the count signals and the order of lengths of the delay times of latch signals may be an order where the delay time increases from the least significant bit to the most significant bit. On the contrary, the order of lengths of the delay times of the count signals and the order of lengths of the delay times of the latch signals may be an order where the delay time increases from the most significant bit to the least significant bit.

Third Embodiment

Figure 6:
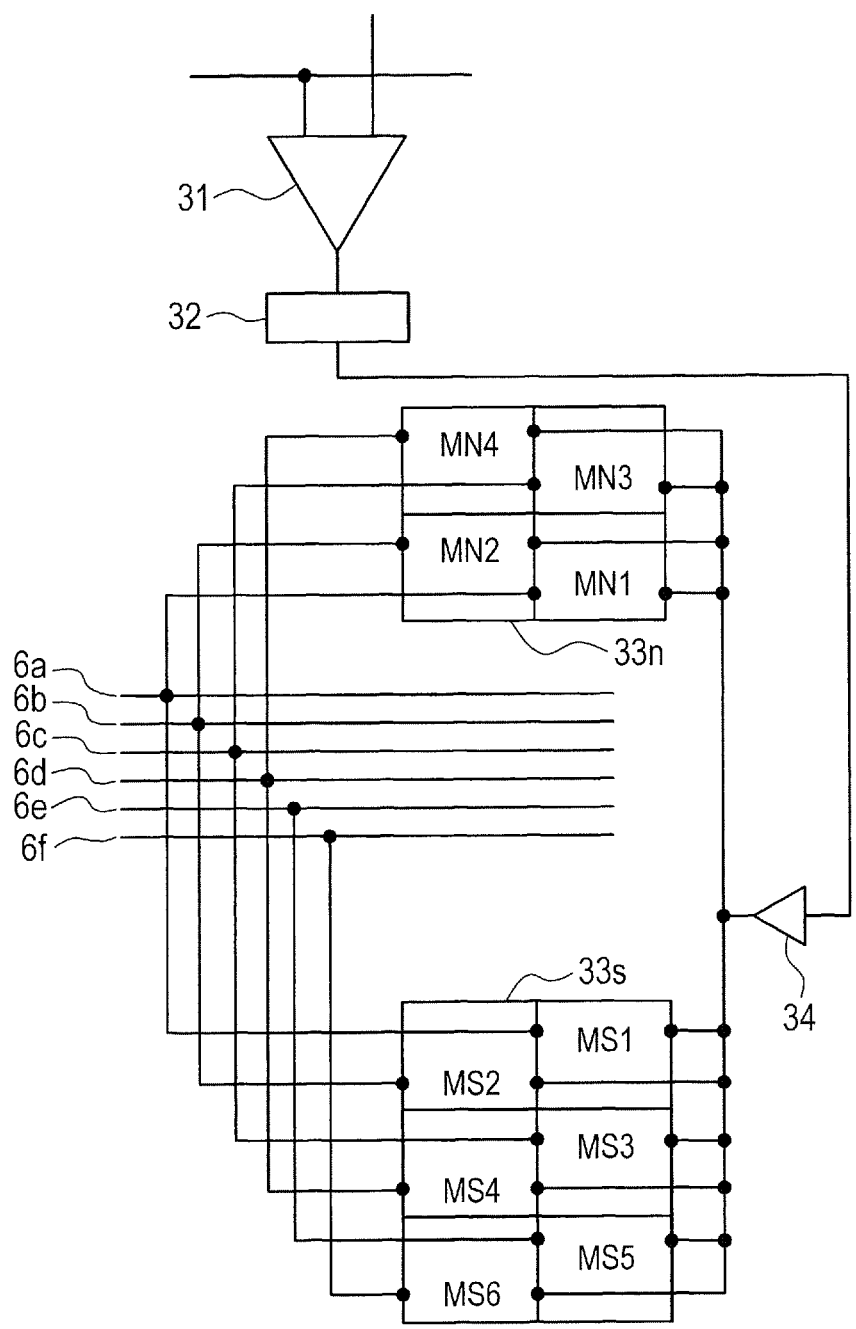
FIG. 6 is a diagram illustrating a layout of a configuration example of a column AD converter according to a third embodiment.

FIG. 6 is a diagram illustrating a layout of a configuration example of a column AD converter 3 according to a third embodiment of the present invention. The difference between this embodiment and the second embodiment is hereinafter described. In the storage unit 33n, odd-numbered bit storage units MN1 and MN3 are arranged on a first column, and even-numbered bit storage units MN2 and MN4 are arranged on a second column. In the storage unit 33s, odd-numbered bit storage units MS1, MS3 and MS5 are arranged on a first column, and even-numbered bit storage units MS2, MS4 and MS6 are arranged on a second column. That is, the storage units 33n and 33s are arranged on the respective two columns. The storage units 33n and 33s can be arranged in multiple columns. Even in this case, the latch signal and the count signal are supplied in an order of the bit storage units MN1, MN2, MN3 and MN4 in the storage unit 33n, and in an order of MS1, MS2, MS3, MS4, MS5 and MS6 in the storage unit 33s. Accordingly, even in the case where the multiple-bit storage units MN1 to MN4 and MS1 to MS6 are arranged in the multiple columns, the relative difference in transmission delay time between the latch signal and the count signal can be reduced, which can improve the linearity of AD conversion.

Fourth Embodiment

FIG. 7 is a diagram illustrating a configuration example of an imaging system according to a fourth embodiment of the present invention. The imaging system 800 includes, for instance, an optical unit 810, a solid-state imaging apparatus 820, a video signal processing unit 830, a recording communicating unit 840, a timing controller unit 850, a system controller unit 860 and a play display unit 870. Any of the solid-state imaging apparatuses in the first to third embodiments may be adopted as the solid-state imaging apparatus 820.

The optical unit 810, which is an optical system including lenses, focuses light from an object on the pixel unit 1 that includes two-dimensionally arranged pixels of the solid-state imaging apparatus 820, thereby forming an image of the object. The solid-state imaging apparatus 820 outputs a signal according to the light image-formed on the pixel unit 1 at timing based on the signal from the timing controller unit 850. The signal output from the solid-state imaging apparatus 820 is input into the video signal processing unit 830. The video signal processing unit 830 performs signal processing according to a method defined by a program. A signal acquired through the process in the video signal processing unit 830 is output as image data to the recording communicating unit 840. The recording communicating unit 840 outputs a signal for forming an image to the play display unit 870, thereby causing the play display unit 870 to play back and display moving images and still images. The recording communicating unit 840 receives a signal from the video signal processing unit 830, and communicates with the system controller unit 860. Furthermore, the recording communicating unit 840 performs an operation for recording the signal for forming an image in a recording medium, not illustrated.

The system controller unit 860 integrally controls the operation of the imaging system, and controls driving of the optical unit 810, the timing controller unit 850, the recording communicating unit 840 and the play display unit 870. Furthermore, the system controller unit 860 includes a storing device that is, e.g., a recording medium and not illustrated. A program required to control the operation of the imaging system is stored in the storing device. The system controller unit 860 supplies the imaging system with signals for switching a driving mode according to, e.g., an operation by a user. In a more specific example, the signals are for changing the row to be read or reset, changing the angle of view in response to electronic zooming, and shifting the angle of view for supporting electronic image stabilization. The timing controller unit 850 controls the drive timing for the solid-state imaging apparatus 820 and the video signal processing unit 830, based on control by the system controller unit 860.

All the embodiments have been only provided as specific examples for implementing the present invention. The technical scope of the present invention cannot be construed to be limited based on these embodiments. That is, the present invention can be variously implemented without departing from the technical thought or principal characteristics.

The degradation of the linearity of AD conversion due to the delay times of the count signal and the write control signal can be reduced.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-027665, filed Feb. 17, 2014, which is hereby incorporated by reference herein in its entirety.

What is claimed is:

1. A solid-state imaging apparatus comprising:
   a plurality of pixels arranged in a matrix, and outputting a signal based on photoelectric conversion and a signal based on a reset-state;
   a comparator configured to compare the signal outputted from the pixel with a reference signal of which level changes dependent on time;
   a counter configured to output a count signal of a plurality of bits;
   a plurality of first bit storage units configured to hold, bit by bit, the count signal, according to a write control signal based on a result of the comparing by the comparator;
   a plurality of second bit storage units configured to hold, bit by bit, the count signal, according to a write control signal based on a result of the comparing by the comparator; and
   a control unit configured to output the write control signal, wherein
   the plurality of first bit storage units hold the count signal at a time of comparing the signal based on the reset-state of the pixel,
   the plurality of second bit storage units hold the count signal at a time of comparing the signal based on the photoelectric conversion of the pixel, and
   an order of lengths of a delay time of the count signal held by the plurality of first bit storage units is same as an order of lengths of the delay time of the write control signal of the plurality of first bit storage units,
   an order of lengths of a delay time of the count signal held by the plurality of second bit storage units is same as an order of lengths of the delay time of the write control signal of the plurality of second bit storage units.

2. The solid-state imaging apparatus according to claim 1, wherein
the control unit is arranged between the comparator and one of the plurality of first bit storage units and the plurality of second bit storage units, the one of the plurality of first bit storage units and the plurality of second bit storage units is arranged closer than the other of the plurality of first bit storage units and the plurality of second bit storage units.

3. The solid-state imaging apparatus according to claim 1, wherein
the control unit is arranged between the plurality of first bit storage units and the plurality of second bit storage units.

4. The solid-state imaging apparatus according to claim 1, wherein
in the plurality of first bit storage units, an order of lengths of lines of the count signal of an one bit and the other one bit each of which is included in the plurality of bits is same as an order of lengths of lines of the write control signal of the one bit and the other one bit,
in the plurality of second bit storage units, an order of lengths of lines of the count signal of an one bit and the other one bit each of which is included in the plurality of bits is same as an order of lengths of lines of the write control signal of the one bit and the other one bit.

5. The solid-state imaging apparatus according to claim 1, further comprising
a plurality of read out circuits each arranged correspondingly to each of columns of the pixels, and reading and holding the signal outputted from the pixel, wherein
the comparator, the plurality of first storage units, the plurality of second bit storage units and the control unit are arranged column by column of the pixels, and
the comparator compares an output signal from the read out circuit with the reference signal.

6. The solid-state imaging apparatus according to claim 1, wherein
the order of lengths of the delay time of the count signal, and the order of lengths of the delay time of the write control signal are in an order such that the delay times increases from a least significant bit to a most significant bit.

7. The solid-state imaging apparatus according to claim 1, wherein
the order of lengths of the delay time of the count signal, and the order of lengths of the delay time of the write control signal are in an order such that the delay times increases from a most significant bit to a least significant bit.

8. The solid-state imaging apparatus according to claim 1, wherein
the delay time of the count signal and the delay time of the write control signal held by the second bit storage unit are respectively longer than the delay time of the count signal and the delay time of the write control signal held by the first bit storage unit, or the delay time of the count signal and the delay time of the write control signal held by the first bit storage unit are respectively longer than the delay time of the count signal and the delay time of the write control signal held by the second bit storage unit.

9. The solid-state imaging apparatus according to claim 1, wherein
the count signal and the write control signal branches between the plurality of first bit storage units and the plurality of second bit storage units.

10. The solid-state imaging apparatus according to claim 1, wherein
the plurality of first bit storage units are arranged in a plurality of columns, and the plurality of second bit storage units are arranged in a plurality of columns.

11. A solid-state imaging apparatus comprising:
a plurality of pixels arranged in a matrix, and outputting a signal based on photoelectric conversion and a signal based on a reset-state;
a comparator configured to compare the signal outputted from the pixel with a reference signal of which level changes dependent on time;
a counter configured to output a count signal of a plurality of bits;
a plurality of first bit storage units configured to hold, bit by bit, the count signal output from the counter, according to a write control signal based on a result of the comparing by the comparator;
a plurality of second bit storage units configured to hold, bit by bit, the count signal output from the counter, according to a write control signal based on a result of the comparing by the comparator; and
a control unit configured to output the write control signal, wherein
the plurality of first bit storage units hold the count signal at a time of comparing the signal based on the reset-state of the pixel,
the plurality of second bit storage units hold the count signal at a time of comparing the signal based on the photoelectric conversion of the pixel, and
the plurality of first bit storage units and the plurality of second bit storage units are adjacent to each other, and each of an output line of the counter and the control unit are arranged at a side of one of the first and the second bit storage units adjacent to each other.

12. The solid-state imaging apparatus according to claim 11, wherein
in the plurality of first bit storage units, an order of lengths of lines of the count signal of an one bit and the other one bit each of which is included in the plurality of bits is same as an order of lengths of lines of the write control signal of the one bit and the other one bit,
in the plurality of second bit storage units, an order of lengths of lines of the count signal of an one bit and the other one bit each of which is included in the plurality of bits is same as an order of lengths of lines of the write control signal of the one bit and the other one bit.

13. The solid-state imaging apparatus according to claim 11, further comprising
a plurality of read out circuits each arranged correspondingly to each of columns of the pixels, and reading and holding the signal outputted from the pixel, wherein
the comparator, the first and second bit storage units and the control unit are arranged column by column of the pixels, and
the comparator compare an output signal from the read out circuit with the reference signal.

14. The solid-state imaging apparatus according to claim 11, further comprising
a plurality of read out circuits each arranged correspondingly to each of columns of the pixels, and reading and holding the signal outputted from the pixel, wherein
the comparator, the plurality of first storage units, the plurality of second bit storage units and the control unit are arranged column by column of the pixels, and
the comparator compares an output signal from the read out circuit with the reference signal.

15. A solid-state imaging apparatus comprising:
a plurality of pixels arranged in a matrix, and outputting a signal based on photoelectric conversion and a signal based on a reset-state;
a comparator configured to compare the signal outputted from the pixel with a reference signal of which level changes dependent on time;
a counter configured to output a count signal of a plurality of bits;
a plurality of first bit storage units configured to hold, bit by bit, the count signal output from the counter, according to a write control signal based on a result of the comparing by the comparator;
a plurality of second bit storage units configured to hold, bit by bit, the count signal output from the counter, according to a write control signal based on a result of the comparing by the comparator; and
a control unit configured to output the write control signal, wherein
the plurality of first bit storage units hold the count signal at a time of comparing the signal based on the reset-state of the pixel,
the plurality of second bit storage units hold the count signal at a time of comparing the signal based on the photoelectric conversion of the pixel, and
each of an output line of the counter and the control unit are arranged between the plurality of first bit storage units and the plurality of second bit storage units are adjacent to each other.

16. The solid-state imaging apparatus according to claim 15, wherein
an order of lengths of lines of the count signal of the first and second bit storage units is the same as an order of lengths of lines of the write control signal of the first and second bit storage units.

17. The solid-state imaging apparatus according to claim 15, further comprising
a plurality of read out circuits each arranged correspondingly to each of columns of the pixels, and reading and holding the signal outputted from the pixel, wherein
the comparator, the plurality of first storage units, the plurality of second bit storage units and the control unit are arranged column by column of the pixels, and
the comparator compares an output signal from the read out circuit with the reference signal.

18. An imaging system comprising:
the solid-state imaging apparatus according to claim 1; and
a signal processing unit configured to generate an image data based on a signal outputted from the solid-state imaging apparatus.

19. An imaging system comprising:
the solid-state imaging apparatus according to claim 11; and
a signal processing unit configured to generate an image data based on a signal outputted from the solid-state imaging apparatus.

20. An imaging system comprising:
the solid-state imaging apparatus according to claim 15; and
a signal processing unit configured to generate an image data based on a signal outputted from the solid-state imaging apparatus.

\* \* \* \* \*